United States Patent
Ueda et al.

[11] Patent Number: 5,993,600
[45] Date of Patent: Nov. 30, 1999

[54] CONTINUOUS FILM LAMINATING AND DELAMINATING SYSTEM

[75] Inventors: Kenji Ueda; Shingo Nishikawa, both of Tokyo, Japan

[73] Assignee: Dai Nippon Printing Co., Ltd., Tokyo, Japan

[21] Appl. No.: 09/002,949

[22] Filed: Jan. 5, 1998

Related U.S. Application Data

[62] Division of application No. 08/598,526, Feb. 8, 1996, Pat. No. 5,755,919.

[30] Foreign Application Priority Data

Feb. 9, 1995 [JP] Japan ................................ 7-21616

[51] Int. Cl.$^6$ .................................................. B32B 31/28
[52] U.S. Cl. .................. 156/379.8; 156/249; 156/272.8; 156/373.5; 359/12; 359/14; 359/35
[58] Field of Search ...................... 156/249, 272.8, 156/273.3, 273.5, 324, 379.6, 379.8, 538; 359/12, 14, 22, 35

[56] References Cited

U.S. PATENT DOCUMENTS

| | | | |
|---|---|---|---|
| 3,306,798 | 2/1967 | Gaenge | 156/249 X |
| 4,263,085 | 4/1981 | Ellis | 156/249 X |
| 4,624,875 | 11/1986 | Watanabe et al. | 156/249 X |

FOREIGN PATENT DOCUMENTS

| | | | |
|---|---|---|---|
| 60-254174 | 12/1985 | Japan | 359/12 |
| 61-156273 | 7/1986 | Japan | 359/12 |
| 63-78191 | 4/1988 | Japan | 359/12 |
| 2-235085 | 9/1990 | Japan | 359/35 |
| 364785 | 3/1991 | Japan | 359/12 |
| 6-118861 | 4/1994 | Japan | 359/12 |

*Primary Examiner*—Mark A. Osele
*Attorney, Agent, or Firm*—Sughrue, Mion, Zinn, Macpeak & Seas, PLLC

[57] ABSTRACT

A system which enables a film, e.g. a photosensitive material film, to be continuously laminated on and delaminated from a surface of a substrate, e.g. a hologram original plate, and allows duplication to be continuously effected. The system includes a film supply part (32) for supplying a film (1), a film laminating part (37) for continuously laminating the supplied film (1) on a film laminating substrate (35), a film delaminating part (37') for continuously delaminating the film from the substrate (35), and a film take-up part (43) for taking up the delaminated film. In the system, no air bubbles are trapped when the film (1) is laminated on the substrate (35), and no peel unevenness, e.g. undesired line, occurs when the film (1) is delaminated from the substrate (35). The system is suitable for use in a hologram duplicating apparatus, a dimple relief pattern duplicating apparatus, a microscopic test sample preparing apparatus, etc.

9 Claims, 5 Drawing Sheets

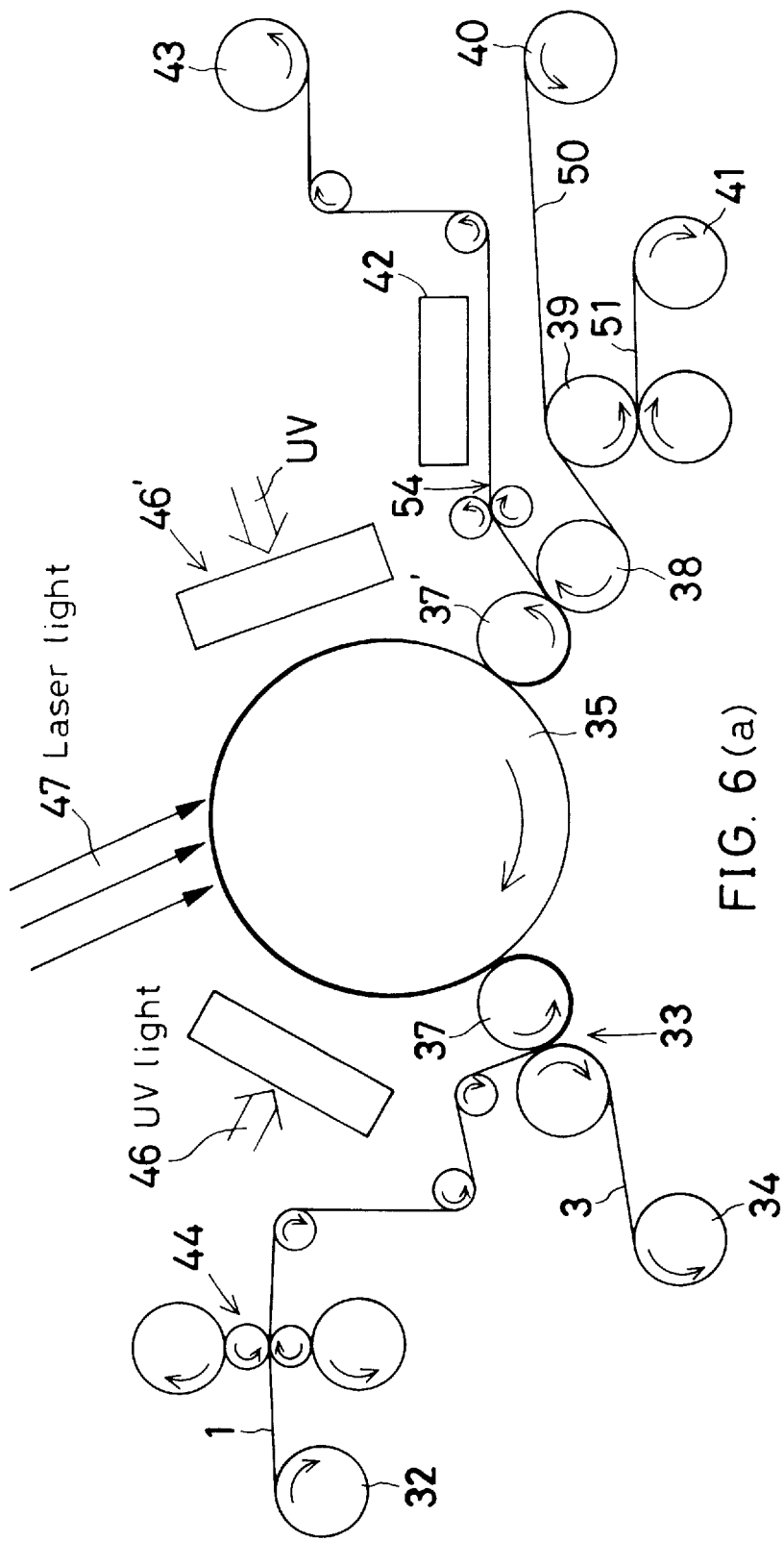
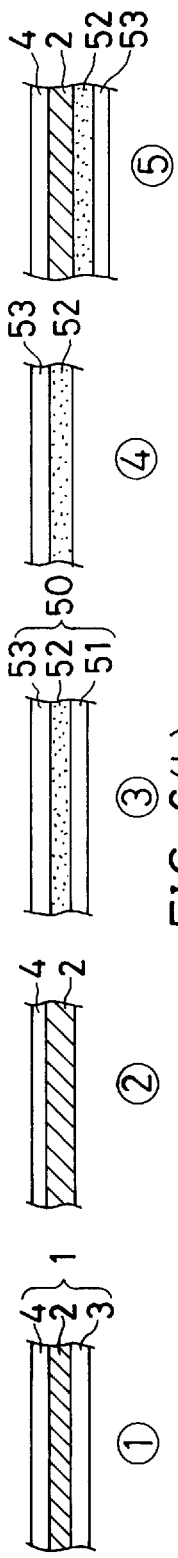
FIG. 6(a)
FIG. 6(b)

CONTINUOUS FILM LAMINATING AND DELAMINATING SYSTEM

This is a divisional of application Ser. No. 08/598,526 filed Feb. 8, 1996 now U.S. Pat. No. 5,755,919.

BACKGROUND OF THE INVENTION

The present invention relates to a continuous film laminating and delaminating system. More particularly, the present invention relates to a system in which a film, e.g. a molding film, a photosensitive material film, a pressure-sensitive adhesive film, etc. is continuously laminated on and delaminated from a surface of a substrate, e.g. a duplicate plate, a hologram original plate, etc.

Conventional techniques will be explained below by taking the case of a hologram duplicating method in particular.

Duplication of a hologram original plate has heretofore been performed by applying laser light to the hologram original plate placed in close contact with a photosensitive material so that diffracted light from the original plate and the incident light interfere with each other in the photosensitive material, thereby recording a hologram image of the original plate in the photosensitive material. In this process, in order to prevent the disorder of the image due to the back reflection component produced by reflection at the reverse surface of the photosensitive material, an index matching liquid that is substantially equal to the original plate in refractive index is interposed between the original plate and the photosensitive material, thereby enhancing the adhesion and thus preventing back reflection during the duplication of the hologram image.

Incidentally, the index matching liquid, which is interposed between the hologram original plate and the photosensitive material, is a thick liquid and difficult to apply with a uniform thickness because of fluidity, thickness unevenness, vibration, etc. In particular, when a large amount of index matching liquid is applied, it is impossible to effect favorable duplication of a hologram due to the flow of the index matching liquid. Even if duplication of a hologram is carried out in a clean room, dust particles of 10 $\mu$m or less in diameter may get mixed in the contact layer structure. If duplication is carried out with dust particles mixed in the contact layer structure, the dust particles undesirably lift the film of photosensitive material and cause duplicating defects due to the flow of the index matching liquid around the dust particles.

To solve such problems, Japanese Patent Application No. 4-327918 proposes a duplicating method and apparatus wherein a cushioning layer is used to bury dust particles to thereby reduce the incidence of duplicating defects. However, the proposed duplicating method and apparatus still suffer from problems in terms of durability and so forth.

In view of the above-described problems of the conventional technique, Japanese Patent Application No. 5-212954 discloses a system in which a film, e.g. a photosensitive material film, is continuously and surely brought into contact with a surface of a substrate, e.g. a hologram original plate, and it is continuously delaminated from the substrate surface.

The invention in the above-mentioned application will be explained below by way of an example in which it is applied to duplication of a hologram. It will, however, be clear from the following explanation that the use application of the system according to the invention is not necessarily limited to duplication of a hologram, but the system may also be applied to duplication of a relief pattern, preparation of a sample of a microscopic specimen, etc.

Duplication of a hologram is carried out as shown in FIG. 1(a). That is, a photosensitive material film 1 is brought into close contact with a surface of a hologram original plate 5 through an index matching liquid 6 having a refractive index substantially equal to that of the original plate 5. Then, laser light 7 is applied from the photosensitive material film side (or from the hologram original plate side, as described later) so that the light 7 and diffracted light 8 from the original plate 5 interfere with each other in the photosensitive material film 1, thereby recording a hologram image in the photosensitive material film 1. The photosensitive material film 1 for hologram recording, which is made of a photopolymer or the like, is usually composed of 3 layers, that is, a base film 3, a photosensitive material 2, and a base film 4. If minute dust particles 9 are mixed in the contact layer structure when the photosensitive material film 1 is brought into close contact with the hologram original plate 5, the dust particles 9 undesirably lift the film 1 and cause duplicating defects due to the flow of the index matching liquid 6 around the dust particles 9.

Therefore, the base film 3 that is closer to the original plate 5 is peeled off to expose the photosensitive material layer 2, which is a viscoelastic material, and the photosensitive material layer 2 is laminated directly on the original plate 5, as shown in FIG. 1(b), thereby burying the dust particles 9 in the layer 2, and thus making it possible to reduce the incidence of duplicating defects.

In this process, it is preferable to remove dust particles from the base films 3 and 4 by using gum rollers, as a matter of course. It is also preferable to use a static eliminator (ionized air spray, corona discharge, etc.) in order to suppress adsorption of dust particles due to static electricity generated when the base film 3 is peeled off.

In Japanese Patent Application No. 5-212954, however, the duplication is carried out by intermittently feeding the film 1 onto the original plate 5 in theory because the original plate 5 is in planar form.

SUMMARY OF THE INVENTION

The present invention was made in order to solve the problem of Japanese Patent Application No. 5-212954, proposed by the present applicant, that duplication cannot be effected continuously but intermittently only. Accordingly, an object of the present invention is to enable a film, e.g. a photosensitive material film, to be continuously laminated on and delaminated from a surface of a substrate, e.g. a hologram original plate, and to allow duplication to be continuously effected by forming the surface of such a substrate into a cylindrical configuration.

To attain the above-described object, the present invention provides an arrangement in which the hologram original plate 5 is fixed on the cylindrical surface of a cylinder, and the hologram surface of the original plate is protected by a substrate having release properties.

Original plates applicable as the hologram original plate 5 are those which comprise a flexible substrate made of a silver halide material, a bichromated gelatin material, a photopolymer material, etc. The hologram original plate 5 is preferably made of a material which has a refractive index close to that of the photosensitive material film 1 for hologram recording, and which is less birefringent.

Incidentally, if air bubbles are trapped when the photosensitive material film 1 with one base film 3 peeled therefrom is laminated directly on the original plate 5 (original plate cylinder 5 in the present invention), as shown in FIG. 1(*b*), the trapped air bubbles will lead to duplicating defects. According to the present invention, therefore, the photosensitive material film 1 is sequentially brought into close contact with the original plate 5 by using a pressure roller. With regard to the diameter of the pressure roller and the film pass, a system as shown in FIG. 2(*b*) is preferable to a system as shown in FIG. 2(*a*). That is, it is preferable that the diameter of the roller 10 should be relatively small, while the film winding angle θ should be relatively large. More specifically, the diameter of the roller 10 is preferably as small as 100 mm or less, more preferably about 50 mm. Because the roller 10 may be deflected, it is preferable to apply pressure to the roller 10 by using another roller having a relatively large diameter. The film winding angle θ is preferably not smaller than 90°. The pressure of the roller 10 and the tension of the film 1 are also preferably set at relatively high levels: That is, the roller pressure is preferably not lower than 0.1 kgf/cm$^2$, and the film tension is preferably not lower than 0.1 kgf/cm.

When laser light is used to duplicate the original plate 5, it is preferable to use an anti-reflection coated glass or film for the purpose of eliminating noise due to the back reflection of the incident light. In the case of a reflection hologram original plate 5, it is preferable to carry out optical duplicating process using a layer configuration such as that shown in FIG. 3(*a*), which is composed, in order from the laser light incidence side, of an anti-reflection coated glass 11, an index matching liquid 12, a base film 4, a photosensitive material 2, a hologram original plate 5, and a light-absorbing material 13. In the case of a transmission hologram original plate 5, it is preferable to perform optical duplicating process using a layer configuration which is composed, as shown in FIG. 3(*b*), of an anti-reflection coated glass 11, a hologram original plate 5, a photosensitive material 2, and a base film 4. The base film 4 is preferably an optical absorption film or an anti-reflection coated film. It should be noted that in the case of a reflection hologram original plate 5, another anti-reflection coated glass 11 may be disposed in place of the light-absorbing material 13 to prevent back reflection of light passing through the original plate 5.

It is also preferable to add an ionizing radiation masking device whereby, prior to the optical duplicating process by the laser light 7, an ionizing radiation to which the photosensitive material 2 is sensitive, such as ultraviolet light, is applied to a region of the photosensitive material 2 other than a region where a hologram image is to be recorded, thereby effecting trimming (i.e. the region that is not used for duplication is sufficiently exposed to the light so as to lose its photosensitivity to the laser light 7).

It should be noted that it is necessary to provide an ionizing radiation irradiator for lowering the adhesion of the photosensitive material film 1 when delaminated from the original plate 5 after the optical duplicating process has been carried out by the laser light 7 as described above. For this purpose, the whole surface of the photosensitive material film 1 should preferably be irradiated with ultraviolet light by using an ultraviolet irradiator installed downstream of the laser exposure part, which is different from the ultraviolet irradiator for trimming. With a view to lowering the adhesion of the original plate 5, it is preferable that the surface of the original plate 5 with which the photosensitive material film 1 is to come in close contact should be subjected to release treatment in advance by using a fluorine-containing releasing agent, a silicone-containing releasing agent, etc.

Incidentally, if one end of the photosensitive material film 1 is merely pulled up from the original plate 5 when the photosensitive material film 1 is to be delaminated, a peel rate difference is produced in the plane of the photosensitive material film 1, resulting in peel unevenness, e.g. an undesired line, along the peel front at a position where the delamination stops or the peel rate is low. Thus, the duplicate which has been favorably made so far becomes defective. More specifically, if the photosensitive material film 1 is pulled up from one end thereof, as shown in FIG. 4(*a*), it is first delaminated rapidly as far as the position ①, shown in the figure, where the delamination suspends. Then, the photosensitive material film 1 is delaminated rapidly as far as the position ②. If such discontinuous delamination is carried out, undesired lines occur on the photosensitive material film 1 at the positions ① and ②. To prevent the occurrence of such lines, the photosensitive material film 1 should preferably be delaminated sequentially while being pressed with a roller 18, as shown in FIG. 4(*b*), in the same way as in the case where the photosensitive material film 1 is laminated on the original plate 5 [FIG. 2(*b*)].

In the photosensitive material film 1 delaminated in this way, the surface of the photosensitive material 2 is exposed. Therefore, it is necessary in order to take up the photosensitive material film 1 effectively to laminate a protective film on the photosensitive material-side surface of the photosensitive material film 1. Accordingly, as shown in FIG. 4(*b*), a protective film 20 having an adhesive layer or pressure-sensitive adhesive layer on one side thereof is laminated on the delaminated photosensitive material film 1, with the adhesive or pressure-sensitive adhesive layer facing toward the film 1, through a roller 19 rotating in reverse relation to the roller 18. In this case, an ionizing radiation treatment may be needed after the protective film 20 has been laminated on the photosensitive material film 1 in order to raise the adhesion. In such a case, an ionizing radiation irradiator must be provided. It should be noted that the photosensitive material film 1 can be made into a seal type photosensitive material film by using a protective film 20 having high release properties.

Although the continuous film laminating and delaminating system according to the present invention has been described above by way of an example in which it is applied to a hologram duplicating apparatus, it should be noted that the present invention may also be applied to other apparatuses, for example, a dimple relief pattern duplicating apparatus in which the original plate 5 is a plate having a dimple relief pattern of a diffraction grating, a Fresnel lens, etc., and the film 1 is a film having a resin layer, e.g. an ultraviolet-curing resin layer, which is capable of duplicating the relief pattern. It is also possible to apply the present invention to a microscopic test sample preparing apparatus in which a substrate is used as the original plate 5, and a microscopic specimen such as a microbe specimen is placed on the substrate. Further, a film having a transparent pressure-sensitive adhesive layer is used as the film 1. The microscopic specimen is buried in the transparent pressure-sensitive adhesive layer, thereby preparing a sample.

As will be clear from the foregoing description, the present invention provides a continuous film laminating and delaminating system which includes a film supply part for supplying a film, a film laminating part for continuously laminating the supplied film on a film laminating substrate, a film delaminating part for continuously delaminating the film from the film laminating substrate, and a film take-up part for taking up the delaminated film.

In this case, it is preferable that the above-described film should have a base film stacked on one side thereof, and a base film peeling part for peeling the base film from the film supplied from the film supply part should be provided between the film supply part and the film laminating part, and that a protective film laminating part for sequentially laminating a protective film on the exposed surface of the film delaminated from the film laminating substrate should be provided between the film delaminating part and the film take-up part.

The present invention may be applied to a hologram duplicating apparatus. That is, a photosensitive material film which is composed of a photosensitive material and a pair of base films attached to both sides of the photosensitive material is used as the above-described film, and a hologram original plate to be duplicated is used as the film laminating substrate. The base film peeling part is disposed so as to peel the base film from a side of the photosensitive material film which is to face the hologram original plate. Moreover, the system is provided with an optical hologram duplicating part for optically duplicating a hologram image of the hologram original plate onto the photosensitive material film which is laminated on the hologram original plate. With this arrangement, it is possible to effect favorable duplication of a hologram.

In the above-described hologram duplicating apparatus, the hologram original plate to be duplicated is fixed on the cylindrical surface of a cylinder, and the hologram surface of the hologram original plate is protected by a substrate having release properties. The hologram original plate to be duplicated is preferably composed of a release layer, a protective substrate, an adhesive layer, a hologram layer, an adhesive layer, a protective substrate, a light-absorbing layer, and an adhesive layer (and the cylinder), which are partly or entirely stacked in the mentioned order. Alternatively, the hologram original plate is preferably composed of a release layer, a protective substrate, an adhesive layer, a hologram layer, an adhesive layer, a protective substrate, a light-absorbing layer, an adhesive layer, a colored glass (sheet), and an adhesive layer (and the cylinder), which are partly or entirely stacked in the mentioned order.

The hologram original plate may be arranged such that the hologram layer includes a plurality of layers having different wavelengths or angles of diffraction, and barrier layers are provided between these layers and between the hologram layer and layers overlying and underlying it.

It is preferable to provide at least either a cleaning gum roller for removing foreign matter from the photosensitive material film supplied from the film supply part, or a static eliminator for preventing adsorption of foreign matter by static electricity.

Further, it is preferable to provide a trimming device for irradiating the photosensitive material film with light in a pattern to which the photosensitive material film is sensitive at the same time as or before the optical duplicating process is carried out in the optical hologram duplicating part, thereby making the photosensitive material film lose its photosensitivity in the pattern of the applied light.

It is also possible to provide a uniform exposure device for reducing the adhesion of the photosensitive material film to the hologram original plate after the optical duplicating process has been carried out in the optical hologram duplicating part.

It is preferable that the protective film should have an adhesive layer or a pressure-sensitive-adhesive layer on one side thereof, and that in the protective film laminating part the protective film should be laminated on the exposed surface of the film delaminated from the film laminating substrate with the adhesive or pressure-sensitive adhesive layer facing toward the exposed surface.

It is also possible to provide an ionizing radiation irradiating part for applying an ionizing radiation to the protective film between the protective film laminating part and the film take-up part.

In the present invention, the continuous film laminating and delaminating system includes a film supply part for supplying a film, a film laminating part for continuously laminating the supplied film on a film laminating substrate, a film delaminating part for continuously delaminating the film from the film laminating substrate, and a film take-up part for taking up the delaminated film. Therefore, no air bubbles are trapped when the film is laminated on the film laminating substrate, and no peel unevenness, e.g. undesired line, occurs when the film is delaminated from the film laminating substrate. Moreover, the series of operations can be continuously carried out.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 6(*a*) and 6(*b*) show the arrangement of a hologram duplicating apparatus in one embodiment of the present invention.

DESCRIPTION OF THE PREFERRED EMBODIMENTS

Embodiments of the continuous film laminating and delaminating system according to the present invention will be described below. In the following embodiments, the present invention is applied to a hologram duplicating apparatus.

[Embodiment 1]

Figure 1A:
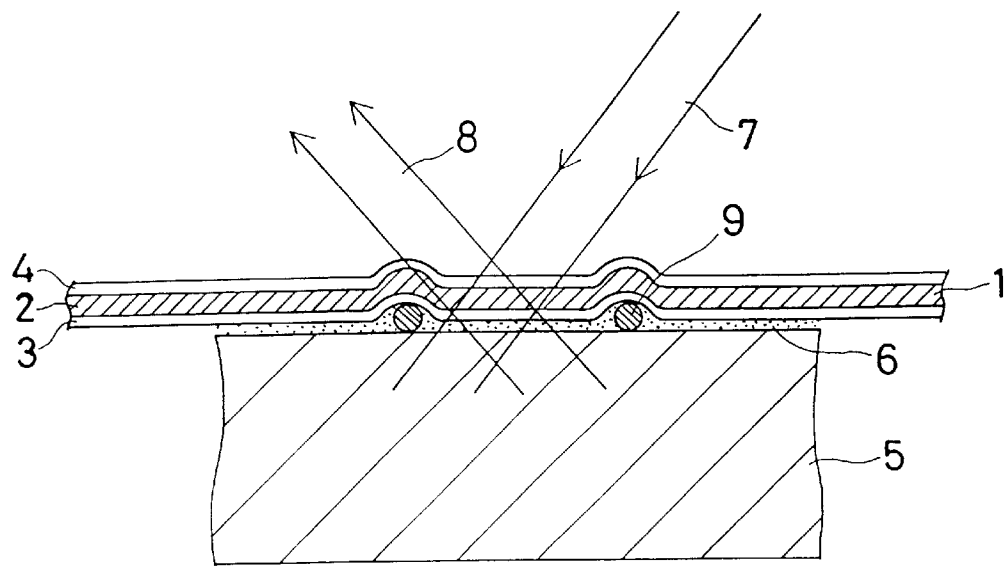
FIGS. 1(*a*) and 1(*b*) show a hologram duplicating method.
Figure 1B:
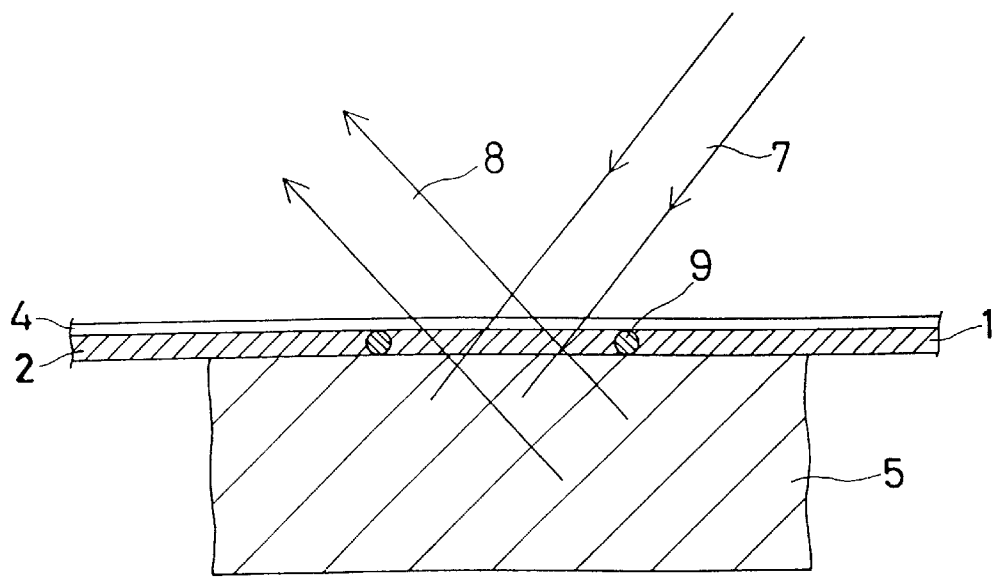
Figure 2A:
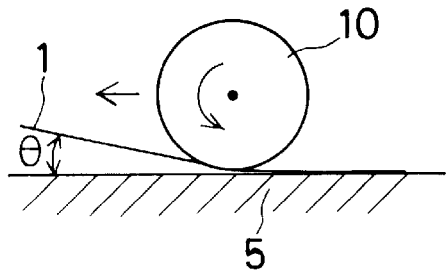
FIGS. 2(*a*) and 2(*b*) show a film laminating method according to the present invention.
Figure 2B:
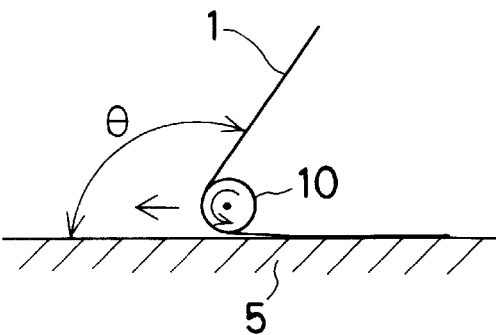
Figure 3A:
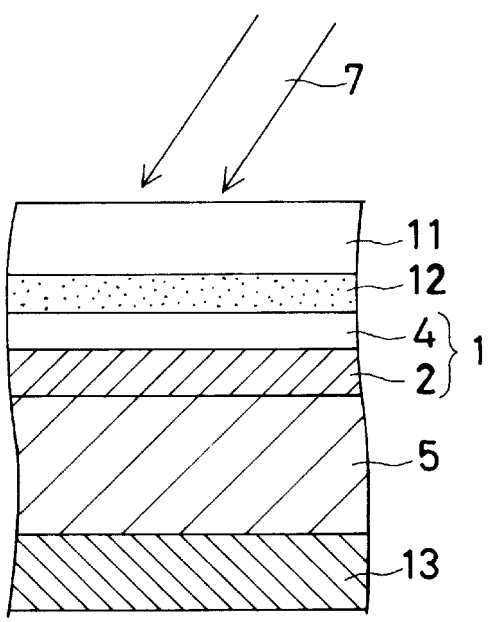
FIGS. 3(*a*) and 3(*b*) show layer configurations usable for hologram duplicating process.
Figure 3B:
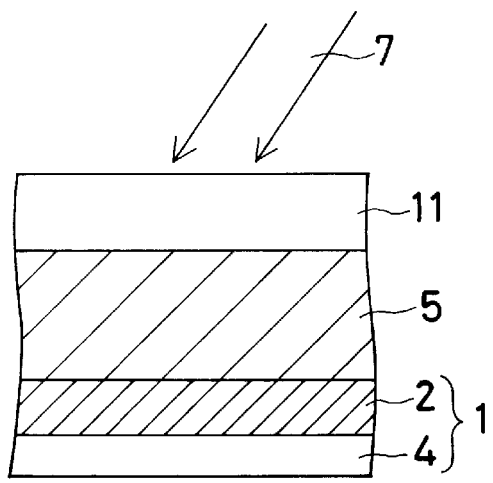
Figure 4A:
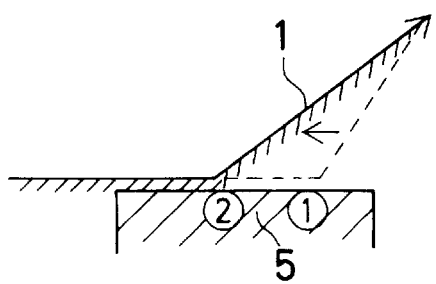
FIGS. 4(*a*) and 4(*b*) show a film delaminating method according to the present invention.
Figure 4B:
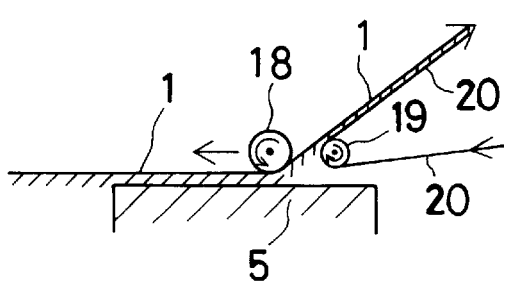
Figure 5:
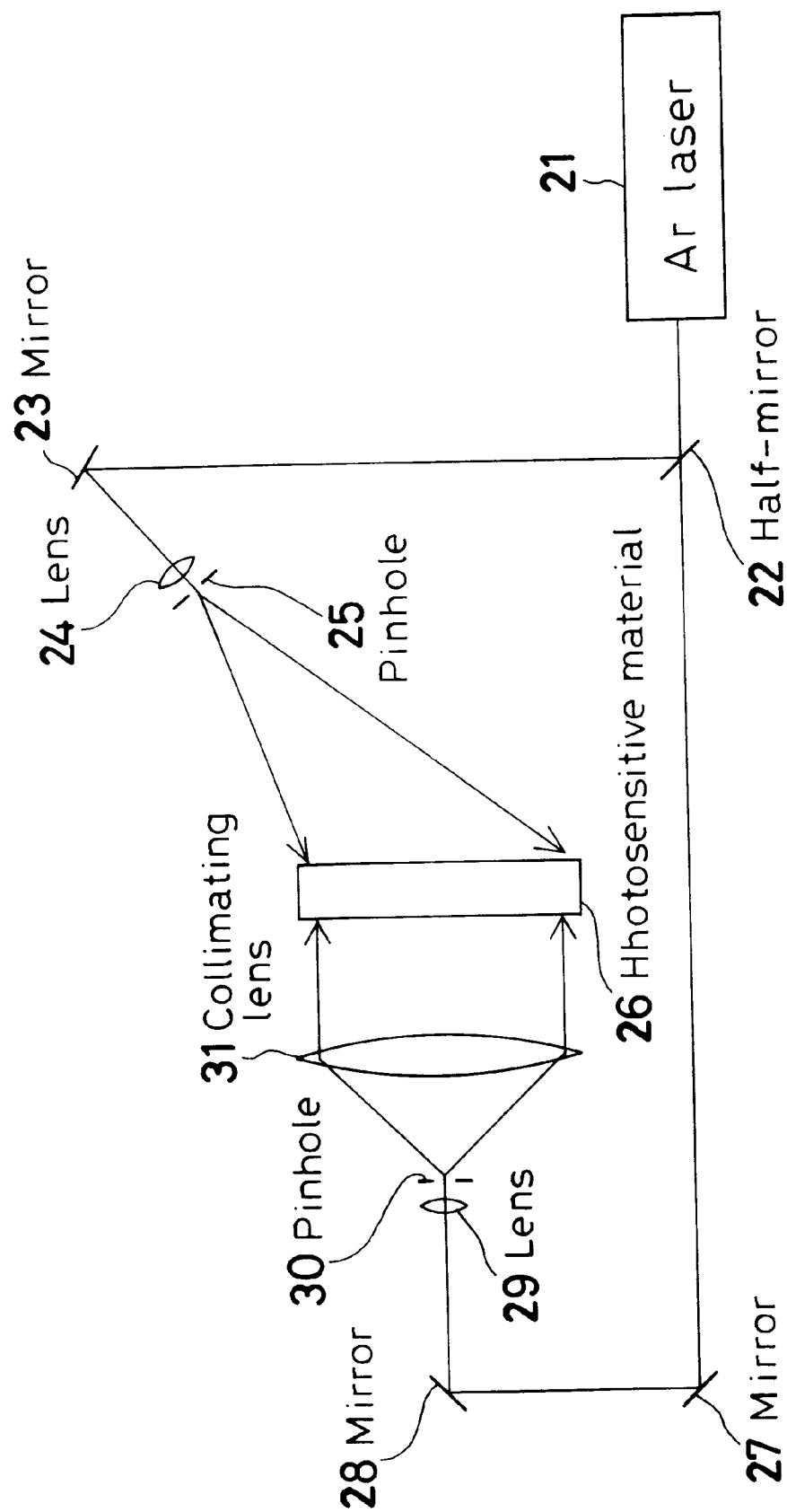
FIG. 5 shows the arrangement of a hologram original plate photographing optical system in one embodiment of the present invention.

A Lippmann hologram (reflection hologram) original plate is photographed by using an optical system such as that shown in FIG. 5. That is, light emitted from an Ar laser 21 is split into two light beams by a half-mirror 22. One light beam passes via a mirror 23 and a lens 24 so as to converge on a pinhole 25. Divergent light emanating from the pinhole 25 is incident obliquely on one side of a photosensitive material 26. The other light beam passes via mirrors 27 and 28 and a lens 29 so as to converge on a pinhole 30, and divergent light emanating from the pinhole 30 is formed into an enlarged parallel light beam by a collimating lens 31 and then incident on the other side of the photosensitive material 26. The two light beams interfere with each other in the photosensitive material 26, thereby recording a hologram in the photosensitive material 26. As the photosensitive material 26, Omnidex-352 holographic recording film, manufactured by Du Pont U.S.A., may be used. The exposure energy is 30 mJ/cm$^2$ by light of wavelength 514 nm from the Ar laser 21. After the exposure, the photosensitive material 26 having a hologram recorded therein is subjected to uniform exposure at 100 mJ/cm$^2$ by using a super-high pressure mercury lamp. Then, the photosensitive material 26 is sandwiched between a pair of triacetylcellulose films and sealed with an optical adhesive (NOA-61, manufactured by Noland U.S.A), thereby preparing a hologram original plate 35. The surface of the hologram original plate 35 with which a duplicating photosensitive material film is to be brought into close contact is subjected to release treatment in advance by using a fluorine-containing releasing agent, a silicone-containing releasing agent, etc.

Next, the hologram original plate 35 is incorporated into a duplicating apparatus such as that shown in FIG. 6(a). In this apparatus, as a duplicating photosensitive material film 1, Omnidex-352 holographic recording film having a triple-layer configuration which is composed of a base film 3, a photosensitive material 2 and a base film 4, as shown in a sectional view in part ① of FIG. 6(b), is used. As a protective film 50, a protective film which is composed, as shown in a sectional view in part ③ of FIG. 6(b), of a PET (polyethylene terephthalate) 51 of 50 μm in thickness, an optical adhesive (NOA-61, manufactured by Noland U.S.A.) 52 of 1 μm in thickness, and a PET 53 of 50 μm in thickness is used.

The arrangement of the duplicating apparatus, together with the operation thereof, will be explained below. A supply roller 32 has the duplicating photosensitive material film 1 set thereon. The film 1 is delivered from the supply roller 32 and cleaned through cleaning rollers 44 which constitute a pair of nip rollers. Then, the base film 3 is peeled off from one side of the film 1 by base film peeling rollers 33 which constitute another pair of nip rollers. The peeled base film 3 is taken up by a take-up roller 34. Meanwhile, the film 1 having the photosensitive material surface exposed is laminated on an original plate cylinder 35 by a pressure roller 37.

Thereafter, projection exposure is carried out by applying ultraviolet light 46 from a super-high pressure mercury lamp (not shown) through a photo-mask, thereby shielding only the central portion of the laminate region of the photosensitive material 2, and exposing the peripheral portion, exclusive of the central portion, at a dose rate of 30 mJ/cm$^2$, and thus making the peripheral portion lose its photosensitivity. In this way, trimming (masking) is carried out.

Next, Ar laser light 47 which is in conjugate relation to the laser light used in the original plate photographing process is applied to the original plate cylinder 35 from the film side (dose rate: 30 mJ/cm$^2$) to effect duplication.

Next, the photosensitive material film 1 is delaminated from the original plate cylinder 35 by a delaminating roller 37'. The photosensitive material film 1 is subjected to ultraviolet exposure by a UV exposure part 46' which is provided between the laser exposure part and the delaminating roller 37' to carry out uniform ultraviolet exposure, thereby facilitating the delamination of the film 1.

Next, a protective film 50 with an adhesive layer 52 is laminated on the photosensitive material side of the photosensitive material film 1 by a laminating roller 38 which constitutes another pair of nip rollers in combination with the delaminating roller 37'. At this time, the base film 51 (PET of 50 μm in thickness) of the protective film 50 supplied from a supply roller 40 is peeled off by a peeling roller 39 and taken up by a take-up roller 41.

The photosensitive material film 1 having the protective film 50 laminated thereon enters an ultraviolet irradiator 42 through another pair of nip rollers 54 for transport. In the ultraviolet irradiator 42, the photosensitive material film 1 is exposed to ultraviolet light from a super-high pressure mercury lamp at 100 mJ/cm$^2$, and thereafter the film 1 is taken up by a take-up roller 43. It should be noted that an antistatic device is provided for each of the peeling rollers 33 and 39 to eliminate static electricity generated at these rollers.

In the above-described apparatus, the layer configurations of the photosensitive material film 1, the protective film 50 and the laminate of these films 1 and 50 at ① to ⑤ in FIG. 6(a) are such as those shown in parts ① to ⑤ of FIG. 6(b). It should be noted that by peeling off the base film 53 from the final product cut into a sheet, the duplicate hologram can be bonded to an article as a hologram seal.

The hologram duplicating apparatus having the above-described arrangement enables favorable duplicate holograms to be continuously and efficiently produced without causing duplicating defects due to foreign matter such as dust particles and air bubbles and without peel unevenness.

[Embodiment 2]

Figure 7:
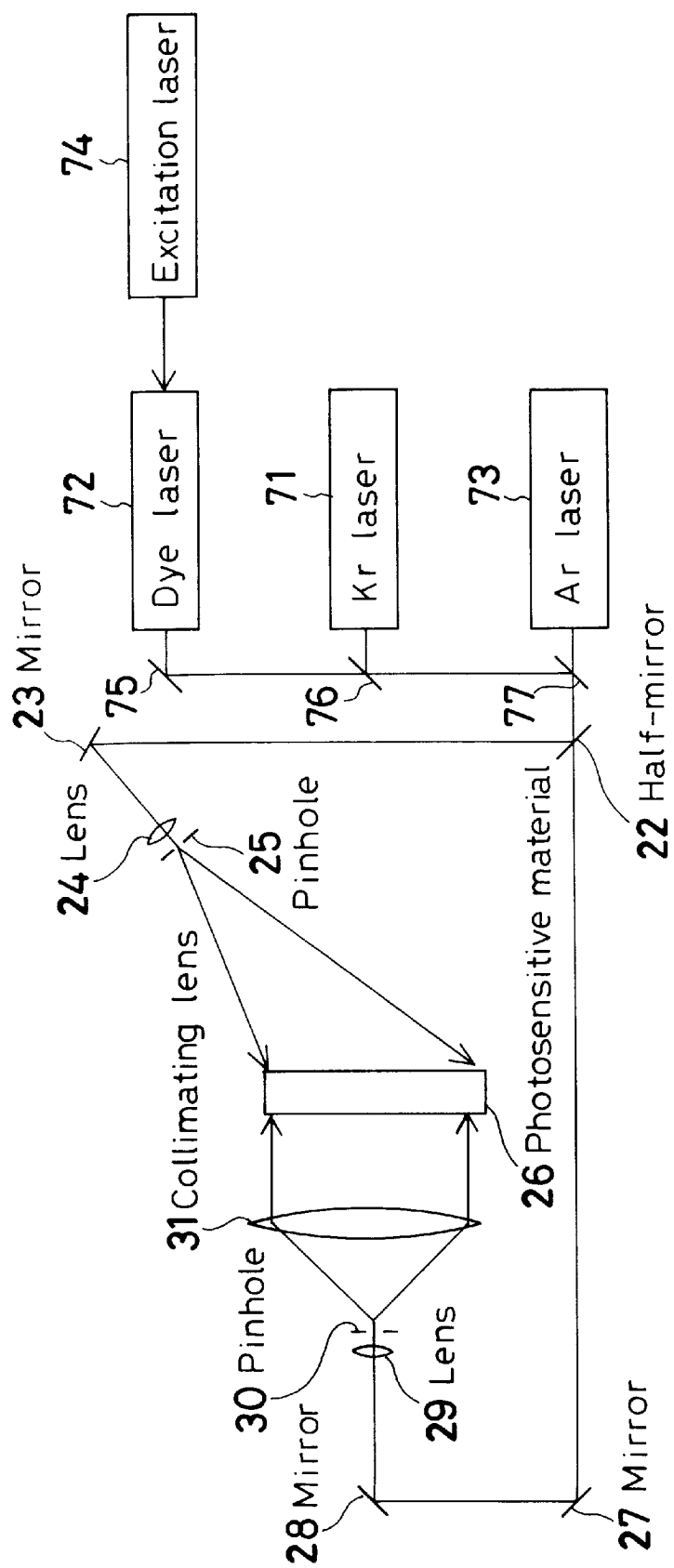
FIG. 7 shows the arrangement of a hologram original plate photographing optical system in another embodiment of the present invention.

A full-color Lippmann hologram (reflection hologram) original plate is produced by using an optical system such as that shown in FIG. 7. First, with one base film peeled off therefrom, Omnidex-705 holographic recording film, manufactured by Du Pont U.S.A., is laminated on a glass (original plate protective glass) of 5 mm in thickness which has been subjected to release treatment. Thereafter, the other base film is peeled off from the holographic recording film, and a PVA (polyvinyl alcohol) film (preferably, non-oriented film) of 5 μm in thickness is laminated on the exposed surface of the holographic recording film. The resulting stack structure is sandwiched between a pair of anti-reflection coated glasses through an index matching liquid (preferably, xylene), thereby preparing a holographic imaging plate (photosensitive material) 26. The photosensitive material 26 is set in the position illustrated in the figure. The optical system is approximately similar to that shown in FIG. 5. In the optical system shown in FIG. 7, however, three lasers are used in order to photograph a full-color hologram. That is, a Kr laser 71 (647 nm) is used as a light source for Red. As a light source for Green, a dye laser 72 (576 nm) with an Ar laser as an excitation laser 74 is used. In addition, an Ar laser 73 (458 nm) is used as a light source for Blue. A totally reflecting mirror 75 and dichroic mirrors 76 and 77 are used to propagate laser lights from these three light sources along one optical path. In the illustrated arrangement, the dichroic mirror 76 is a red narrow-band mirror having anti-reflection coating provided on the reverse surface thereof. The dichroic mirror 77 is a mirror that has anti-reflection coating provided-on the reverse surface thereof and that selectively reflects only light of wavelength 500 nm or shorter. However, the arrangement of the lasers 71 to 73 is not necessarily limited to the illustrated example but may be changed as desired. In such a case, it is necessary to change the arrangement and reflection band of the totally reflecting mirror 75 and the dichroic mirrors 76 and 77.

With the above-described arrangement, first, a hologram is recorded by using only Kr laser light (647 nm). The exposure energy is 30 mJ/cm$^2$, and after the exposure process, uniform exposure is carried out at 100 mJ/cm$^2$ using a super-high pressure mercury lamp. Next, the two anti-reflection coated glasses are removed, and the index matching liquid is dried. Thereafter, Omnidex-705 and a PVA layer are successively stacked on the surface of the PVA film by the same method as the above, and the resulting stack structure is sandwiched between a pair of anti-reflection coated glasses again, thereby preparing a holographic imaging plate 26.

With the laser light changed to dye laser light (576 nm), uniform exposure is similarly carried out at 30 mJ/cm², and then uniform exposure is carried out using a super-high pressure mercury lamp. Further, the same process as the above is repeated. With the laser light changed to Ar laser light (458 nm), third exposure is carried out. After the uniform exposure, the anti-reflection coated glasses are removed, and the index matching liquid is dried. Thereafter, the holographic recording film is delaminated from the glass of 5 mm in thickness, and a pair of triacetylcellulose films are bonded to both sides of the film through an optical adhesive (NOA-61, manufactured by Noland U.S.A.).

Further, black spray [SSP spray black, manufactured by Atom Kagaku Toryo (k.k.)] is uniformly coated on the surface of one triacetylcellulose film and then dried to form an antihalation layer. Further, the surface of the other triacetylcellulose film is coated with a silicone-containing releasing agent [KE42TS', manufactured by Shinetsu Chemical (k.k.)] to form a release layer, thereby preparing an original plate 35 to be duplicated.

Next, the hologram original plate 35 is incorporated into a duplicating apparatus such as that shown in FIG. 6(*a*). In this apparatus, as the duplicating photosensitive material film 1, Omnidex-705 holographic recording film having a triple-layer configuration which is composed of a base film 3, a photosensitive material 2 and a base film 4, as shown in a sectional view in part ① of FIG. 6(*b*), is used. As a protective film 50, a protective film which is composed, as shown in a sectional view in part ③ of FIG. 6(*b*), of a PET (polyethylene terephthalate) 51 of 50 μm in thickness, an optical adhesive (NOA-61, manufactured by Noland U.S.A.) 52 of 1 μm in thickness, and a PET 53 of 50 μm in thickness is used.

The arrangement of the duplicating apparatus, together with the operation thereof, will be explained below. A supply roller 32 has the duplicating photosensitive material film 1 set thereon. The film 1 is delivered from the supply roller 32 and cleaned through cleaning rollers 44 which constitute a pair of nip rollers. Then, the base film 3 is peeled off from one side of the film 1 by base film peeling rollers 33 which constitute another pair of nip rollers. The peeled base film 3 is taken up by a take-up roller 34. Meanwhile, the film 1 having the photosensitive material surface exposed is laminated on an original plate cylinder 35 by a pressure roller 37.

Thereafter, projection exposure is carried out by applying ultraviolet light 46 from a super-high pressure mercury lamp (not shown) through a photo-mask, thereby shielding only the central portion of the laminate region of the photosensitive material 2, and exposing the peripheral portion, exclusive of the central portion, at a dose rate of 30 mJ/cm², and thus making the peripheral portion lose its photosensitivity. In this way, trimming (masking) is carried out.

Next, Ar laser light, Kr laser light and dye laser light 47, which are in conjugate relation to the laser light used in the original plate photographing process, are successively applied to the original plate cylinder 35 from the film side (dose rate: 30 mJ/cm²) to effect duplication.

Next, the photosensitive material film 1 is delaminated from the original plate cylinder 35 by a delaminating roller 37'. The photosensitive material film 1 is subjected to ultraviolet exposure by a UV exposure part 46' which is provided between the laser exposure part and the delaminating roller 37' to carry out uniform ultraviolet exposure, thereby facilitating the delamination of the film 1.

Next, a protective film 50 with an adhesive layer 52 is laminated on the photosensitive material side of the photosensitive material film 1 by a laminating roller 38 which constitutes another pair of nip rollers in combination with the delaminating roller 37'. At this time, the base film 51 (PET of 50 μm in thickness) of the protective film 50 supplied from a supply roller 40 is peeled off by a peeling roller 39 and taken up by a take-up roller 41.

The photosensitive material film 1 having the protective film 50 laminated thereon enters an ultraviolet irradiator 42 through another pair of nip rollers 54 for transport. In the ultraviolet irradiator 42, the photosensitive material film 1 is exposed to ultraviolet light from a super-high pressure mercury lamp at 100 mJ/cm², and thereafter the film 1 is taken up by a take-up roller 43. It should be noted that an antistatic device is provided for each of the peeling rollers 33 and 39 to eliminate static electricity generated at these rollers.

In the above-described apparatus, the layer configurations of the photosensitive material film 1, the protective film 50 and the laminate of these films 1 and 50 at ① to ⑤ in FIG. 6(*a*) are such as those shown in parts ① to ⑤ of FIG. 6(*b*). It should be noted that by peeling off the base film 53 from the final product cut into a sheet, the duplicate hologram can be bonded to an article as a hologram seal.

Although the present invention has been described above by way of embodiments in which the continuous film laminating and delaminating system according to the present invention is applied to a hologram duplicating apparatus, it should be noted that the present invention is not necessarily limited to these embodiments, and that various changes and modifications may be imparted thereto, and the present invention is applicable to various other use applications.

As will be clear from the foregoing description, the continuous film laminating and delaminating system according to the present invention includes a film supply part for supplying a film, a film laminating part for continuously laminating the supplied film on a film laminating substrate, a film delaminating part for continuously delaminating the film from the film laminating substrate, and a film take-up part for taking up the delaminated film. Therefore, no air bubbles are trapped when the film is laminated on the film laminating substrate, and no peel unevenness, e.g. undesired line, occurs when the film is delaminated from the film laminating substrate. Moreover, the series of operations can be continuously carried out. Accordingly, the system according to the present invention is suitable for use in a hologram duplicating apparatus, a dimple relief pattern duplicating apparatus, a microscopic test sample preparing apparatus, etc.

What we claim is:

1. A continuous film laminating and delaminating system comprising:

a film supply part for supplying a photosensitive material film, said photosensitive material film being composed of a photosensitive material and a pair of base films attached to both sides of said photosensitive material;

a film laminating part for continuously laminating said photosensitive material film on a film laminating substrate, said film laminating substrate being a hologram original plate to be duplicated;

a base film peeling part for peeling one of said pair of base films from said photosensitive material film supplied from said film supply part, said base film peeling part being provided between said film supply part and said film laminating part and disposed so as to peel said one of said pair of base films from a side of said photosensitive material film which is to face said hologram original plate;

an optical hologram duplicating part for optically duplicating a hologram image of said hologram original plate onto said photosensitive material film which is laminated on said hologram original plate;

a film delaminating part for continuously delaminating said photosensitive material film from said film laminating substrate;

a film take-up part for taking up the delaminated photosensitive material film;

a protective film laminating part for sequentially laminating a protective film on an exposed surface of the photosensitive material film delaminated from said film laminating substrate, said protective film laminating part being provided between said film delaminating part and said film take-up part;

wherein said hologram original plate is fixed on a cylindrical surface of a cylinder, and a hologram surface of said hologram original plate is protected by a substrate having release properties.

2. A continuous film laminating and delaminating system according to claim 1, wherein said the primary film is a photosensitive material film which is composed of a photosensitive material and a pair of base films attached to both sides of said photosensitive material, and said film laminating substrate is a hologram original plate to be duplicated, said base film peeling part being disposed so as to peel said base film from a side of said photosensitive material film which is to face said hologram original plate, said system further comprising an optical hologram duplicating part for optically duplicating a hologram image of said hologram original plate onto said photosensitive material film which is laminated on said hologram original plate.

3. A continuous film laminating and delaminating system according to claim 2, wherein said hologram original plate has a hologram layer including a plurality of layers having different wavelengths or angles of diffraction, and barrier layers are provided between these layers and between said hologram layer and layers overlying and underlying it.

4. A continuous film laminating and delaminating system according to claim 2, further comprising at least either a cleaning gum roller for removing foreign matter from said photosensitive material film supplied from said film supply part, or a static eliminator for preventing adsorption of foreign matter by static electricity.

5. The continuous film laminating and delaminating system according to claim 1, wherein said substrate having release properties is treated in advance to a release treatment using a fluorine containing release agent.

6. The continuous film laminating and delaminating system according to claim 1, wherein said substrate having release properties is treated in advance to a release treatment using a silicone containing release agent.

7. The continuous film laminating and delaminating system according to claim 1, wherein said hologram original plate is comprises layers stacked according to the following order:

said substrate having release properties, a first protective substrate, a hologram layer, a second protective substrate, and a light-absorbing layer.

8. The continuous film laminating and delaminating system according to claim 1, wherein said hologram original plate is comprises layers stacked according to the following order:

said substrate having release properties, a first protective substrate, a hologram layer, a second protective substrate, a light-absorbing layer, and a colored glass sheet.

9. A continuous film laminating and delaminating system according to claim 2, wherein said protective film has an adhesive layer or a pressure-sensitive adhesive layer on one side thereof, and in said protective film laminating part said protective film is laminated on the exposed surface of said photosensitive material film delaminated from said film laminating substrate with said adhesive or pressure-sensitive adhesive layer facing toward said exposed surface.

* * * * *